(12) United States Patent
Wang et al.

(10) Patent No.: US 9,076,629 B2
(45) Date of Patent: Jul. 7, 2015

(54) PARTICLE DETECTION SYSTEM

(71) Applicant: Hermes Microvision Inc., Hsinchu (TW)

(72) Inventors: Yi-Xiang Wang, Fremont, CA (US); Joe Wang, Campbell, CA (US); Wei-Ming Ren, San Jose, CA (US)

(73) Assignee: HERMES MICROVISION INC., Hsinchu (TW)

( * ) Notice: Subject to any disclaimer, the term of this patent is extended or adjusted under 35 U.S.C. 154(b) by 0 days.

(21) Appl. No.: 13/939,675

(22) Filed: Jul. 11, 2013

(65) Prior Publication Data

US 2013/0327953 A1 Dec. 12, 2013

Related U.S. Application Data

(62) Division of application No. 12/968,229, filed on Dec. 14, 2010, now Pat. No. 8,552,377.

(51) Int. Cl.
*H01J 37/244* (2006.01)
*H01J 37/28* (2006.01)

(52) U.S. Cl.
CPC .............. *H01J 37/244* (2013.01); *H01J 37/28* (2013.01); *H01J 2237/24435* (2013.01); *H01J 2237/2444* (2013.01); *H01J 2237/2449* (2013.01)

(58) Field of Classification Search
CPC ....................................................... H01J 37/28

USPC ......................................................... 250/310
See application file for complete search history.

(56) References Cited

U.S. PATENT DOCUMENTS

| | | | |
|---|---|---|---|
| 3,254,252 A | 5/1966 | Anderson et al. | |
| 3,461,332 A * | 8/1969 | Sheldon | 313/379 |
| 5,134,337 A | 7/1992 | Kongslie et al. | |
| 5,811,805 A * | 9/1998 | Osakabe et al. | 250/311 |
| 6,717,146 B2 * | 4/2004 | Chang et al. | 250/315.3 |
| 6,906,318 B2 | 6/2005 | Bateman et al. | |
| 7,157,697 B2 * | 1/2007 | Bateman et al. | 250/281 |
| 7,365,324 B2 * | 4/2008 | Noji et al. | 250/310 |
| 7,511,271 B2 * | 3/2009 | Hatano et al. | 250/310 |
| 2002/0175283 A1 * | 11/2002 | Chang et al. | 250/315.3 |
| 2004/0046117 A1 | 3/2004 | Gonin et al. | |
| 2005/0174052 A1 | 8/2005 | Niigaki et al. | |
| 2008/0087831 A1 | 4/2008 | Ohmura et al. | |
| 2010/0163725 A1 * | 7/2010 | Barkshire et al. | 250/305 |
| 2010/0237243 A1 * | 9/2010 | Noji et al. | 250/310 |
| 2011/0062327 A1 * | 3/2011 | Fujisawa et al. | 250/311 |
| 2011/0073757 A1 * | 3/2011 | Tanaka | 250/307 |

* cited by examiner

*Primary Examiner* — Robert Kim
*Assistant Examiner* — Eliza Osenbaugh-Stewar
(74) *Attorney, Agent, or Firm* — WPAT, PC; Justin King (57) ABSTRACT

This invention provides a design to process a large range of detection beam current at low noise with a single detector. With such a design, the detection system can generate up to $10^{10}$ gain and maximum signal output at more than mini Ampere (mA) level. A condenser lens is configured to increase bandwidth of the detector that scan speed can be enhanced.

15 Claims, 10 Drawing Sheets

PARTICLE DETECTION SYSTEM

CROSS-REFERENCE TO RELATED APPLICATIONS

This application is a divisional of U.S. application Ser. No. 12/968,229, filed on Dec. 14, 2010 and entitled PARTICLE DETECTION SYSTEM, the entire contents of which are incorporated herein by reference.

FIELD OF THE INVENTION

The present invention relates to a particle detection system, and more particularly to an electron detection device used for an E-beam system.

BACKGROUND OF THE INVENTION

Particle detection systems are used or applied in many facilities, such as electron beam system, scanning electron microscope (SEM), focused ion beam (FIB), mass spectrograph, or other facility necessary to detect particles with or without charge, photons.

Electron beam wafer inspection tool (EBWIT) needs large range of beam current to meet both high throughput (HT) mode and high resolution (HR) mode, in which the HT mode is driven by productivity and the HR mode is driven, on the opposite side, by design rule which now continues shrinking. The EBWIT usually uses several tens to several hundreds nA (nano Ampere) beam current for HT mode and uses several to several tens of pA (pico Ampere) beam current for HR mode. This requires the electron detector used in the EBWIT can handle the signal beam current (SE+BSE) from several tens of pA to several hundreds of nA. This requirement is a huge challenge for any current electron detection system.

Nowadays, there is no EBWIT that can be operated under both HT mode and HR mode; basically, HT mode is more popular due to the majority of the EBWIT detectors is SPD (semiconductor photodiode detector). For the HR mode, received detected current from specimen is too small for the SPD that output signal current, with about 2000 gain from the input signal current, is still a long way off to handle for the EBWIT.

Currently, semiconductor photo diode (SPD) is widely used for the EBWIT due to its low noise and potential of handling large beam current nature, such as several mA (mini Ampere). However, the gain obtained from SPD is very low (~2000@10 KV) for pA detection current and not easy to be increased.

High gain, such as $10^4$-$10^7$, can be acquired from using Phosphor-PMT (phosphor multiplier tube) system and MCP (micro channel plate) detectors. However, most PMT and MCP can only output maximal several uA signal current, which cannot meet the requirement of large beam current at low noise level, because the dynode in PMT limits the output current and the gain variation is too large when PMT dynode operates at low voltage. Further, although the Phosphor-PMT system can achieve high gain, but high bandwidth scintillator usually contributes high level white noise. However, if the image-average technique is used to eliminate the white noise, the throughput will be seriously hurt.

According to the above discussion, no detector system can output signal in the range from pA to mA. Thus, it is an important topic to formulate a particle detection system that can have a large range of gain and output signal current with low noise to meet both HT and HR modes requirement.

Further, in order to handle such a situation, Wang et al. suggested a Bi-Type detection system in U.S. patent application Ser. No. 12/715,766 filed on Mar. 2, 2010.

SUMMARY OF THE INVENTION

The present invention is directed to a particle detection system, which can detect charged or uncharged particles.

The present invention is also directed to an electron detection system, which gain of both electron detection system and particle detection system can be increased up to $10^{10}$ with mA output signal current.

The present invention is also directed to a scanning electron microscope can be applied as EBWIT to meet both HT mode and HR mode requirements.

In one embodiment, the particle detection system includes a charged particle multiplier device for receiving original particles to be detected and generating a plurality of multiplied charged particles to obtain a first level gain, a charged particle detection device for receiving the plurality of multiplied charged particles and generating output signal corresponding to the original particles, and a condenser lens is configured between the charged particle multiplier device and the charged particle detection device to converge the plurality of multiplied charged particles into the charged particle detection device, wherein an electric potential is applied between the charged particle multiplier device and the charged particle detection device to accelerate the plurality of multiplied charged particles to arrive the charged particle detection device to obtain a second level gain.

The condenser lens can be an electrostatic lens. Gain of the particle detection system can be adjusted by an electric field from the electrostatic lens, wherein the electric field can be ranged from 5 KV to 15 KV. The particle detection system further comprises a metal mesh configured to said charged particle multiplier device, and an energy filter between the charge particle multiplier device and the metal mesh. The particle detection system further comprises a means for driving the original particles from the metal mesh to the energy filter, wherein the means for driving the original particles is draft tube structure.

The charged particle detection device can be a semiconductor photo diode. If the original particles are original charged particles, the charged particle multiplier device can be a microchannel plate. If the original charged particles are electrons, the charged particle multiplier device can be an electron multiplier.

In another embodiment, this invention provides an E-beam wafer inspection tool, which comprises an electron gun for emitting a primary beam, a primary beam condenser lens for condensing the primary beam, an objective lens for receiving the primary beam from the primary beam condenser lens and focusing the primary beam on to a surface of a specimen, a particle detection system for receiving particles emanating from the surface of the specimen, and means for generating images from the output signal. The particle detection system includes a charged particle multiplier device for receiving original particles to be detected and generating a plurality of multiplied charged particles to obtain a first level gain, a charged particle detection device for receiving the plurality of multiplied charged particles and generating output signal corresponding to the original particles, and a condenser lens is configured between the charged particle multiplier device and the charged particle detection device to converge the plurality of multiplied charged particles into the charged particle detection device, wherein an electric potential is applied between the charged particle multiplier device and the charged particle detection device to accelerate the plurality of multiplied charged particles to arrive the charged particle detection device to obtain a second level gain.

DESCRIPTION OF THE EXEMPLARY EMBODIMENTS

The present invention provides a particle detection system. For complete understanding of the present invention, the following description will describe in detail the components. The present invention is not limited by the specified particulars of the particle detection system that are familiar to persons skilled in the art. In addition, well-known components are not described in detail so as to avoid any additional limitation. The preferable embodiments of the present invention are described in detail. In addition to the detailed descriptions, the present invention also can be applied to other embodiments. Therefore, the scope of the present invention is not limited, and is dependent on the following claims.

This invention applied an electric field between a charged particle multiplier device for receiving original particles to be detected and a charged particle detection device for receiving the plurality of multiplied charged particles in a particle detection system, in which the charged particle multiplier device generates a plurality of multiplied charged particles to obtain a first level gain, and the charged particle detection device generates an output signal corresponding to the original particles. A condenser lens is configured between the charged particle multiplier device and the charged particle detection device to condense or converge the plurality of multiplied charged particles into the charged particle detection device. The charged particle detection device, by adjusting the field applied between the charged particle multiplier device and the charged particle detection device, provide second gain for the charged particles multiplied by the charged particle multiplier device.

The signal particles to be detected are converted to charged particles in the charge particle multiplier device and multiplied, and the gain can be adjusted by adjusting the power applied on the charged particle multiplier device. The charge particle multiplier device can be a microchannel plate (MCP) if the signal particles, or original particles, are charged particles, in some cases electrons. The charged particle multiplier device can be, but is not limited to, microchannel plate (without anode) for charged particle detection, electron multiplier (without anode) for electron detection, phosphor+ photo cathode+electron multiplier or MCP plate (without anode) for photon detection, etc.

The charge detection device can be, but is not limited to, semiconductor photodiode (SPD), such as PiN, NiP etc. in most cases. Bandwidth of the SPD can be enhanced by using the condense lens, because multiplied charged particles are weakly focused, or condensed by the condense lens and a smaller area of the SPD can be used to received the multiplied charged particles. The function of the charged particle detection device is to acquire second gain for the charged particles, and to generate a large output signal current (>0.1 mA) with low noise level. The second gain can be adjusted by changing the high voltage acceleration field between the charge particle multiplier device and the charge particle detection device.

A metal mesh may be placed in the front of the charged particle multiplier device, for example electron multiplier device, to prevent the leaking of the field applied on the electron multiplier device and attract the multiplied charged particle to the detector if used for detecting charged particles.

An energy filter can be configured in front of the charged particle multiplier device to filter out some signal electrons without enough energy. A driving means, for example can be sidewall potential, or draft tube structure, will force signal electrons from mesh to energy filter or MCP without bombarding to the sidewall.

Figure 1:
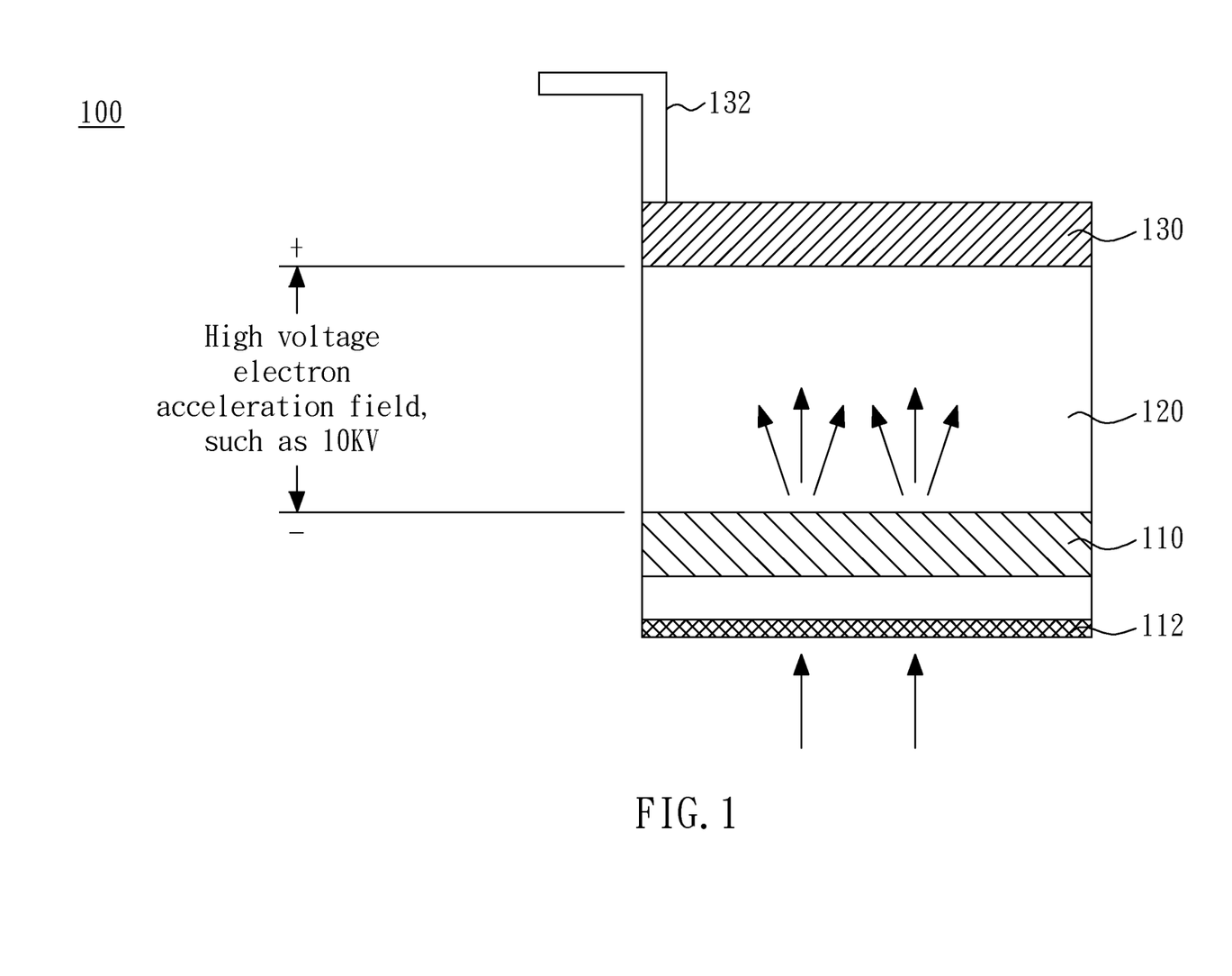
FIG. 1 is a schematic diagram for illustrating particle detection system according to an embodiment of the present invention.

Please refer to FIG. 1, wherein a particle detection system 100 comprises a charged particle multiplier device 110 for receiving original particles to be detected and then generating a plurality of charged particles and a charged particle detection device 130 for receiving the plurality of charged particles and generating an output signal corresponding to the original particles through a signal output interface 132. An electric field of electric potential within a drift tube type housing 120 can be applied between the charged particle multiplier device 110 and the charged particle detection device 130 to accelerate the plurality of charged particles to arrive the charged particle detection device 130. The original particles in this invention can include photons, and charged particles, wherein the charged particles may be ions, electrons, or other particle with positive charge or negative charge.

Figure 2:
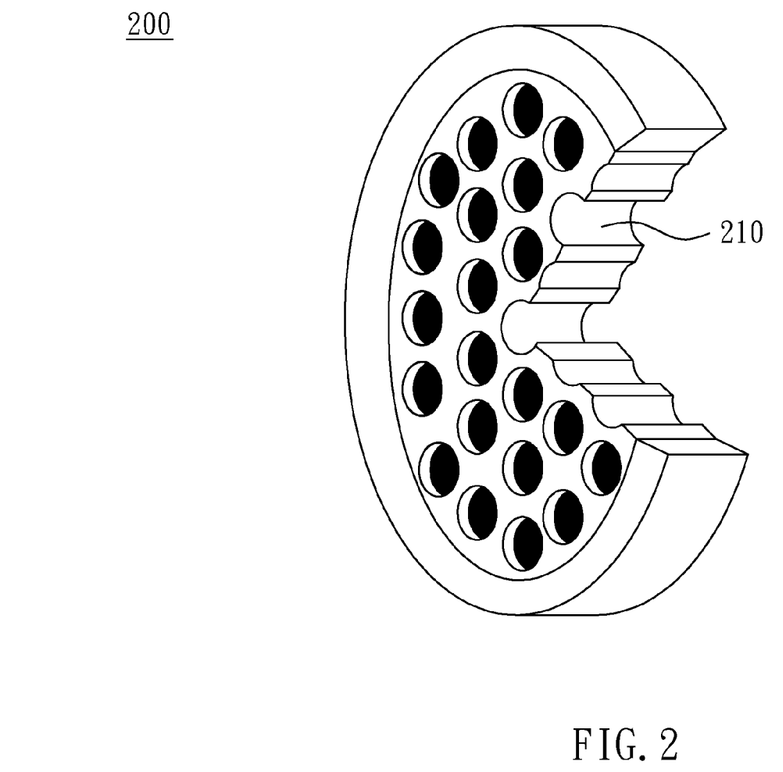
FIG. 2 is a schematic diagram for illustrating MCP inner structure.
Figure 3:
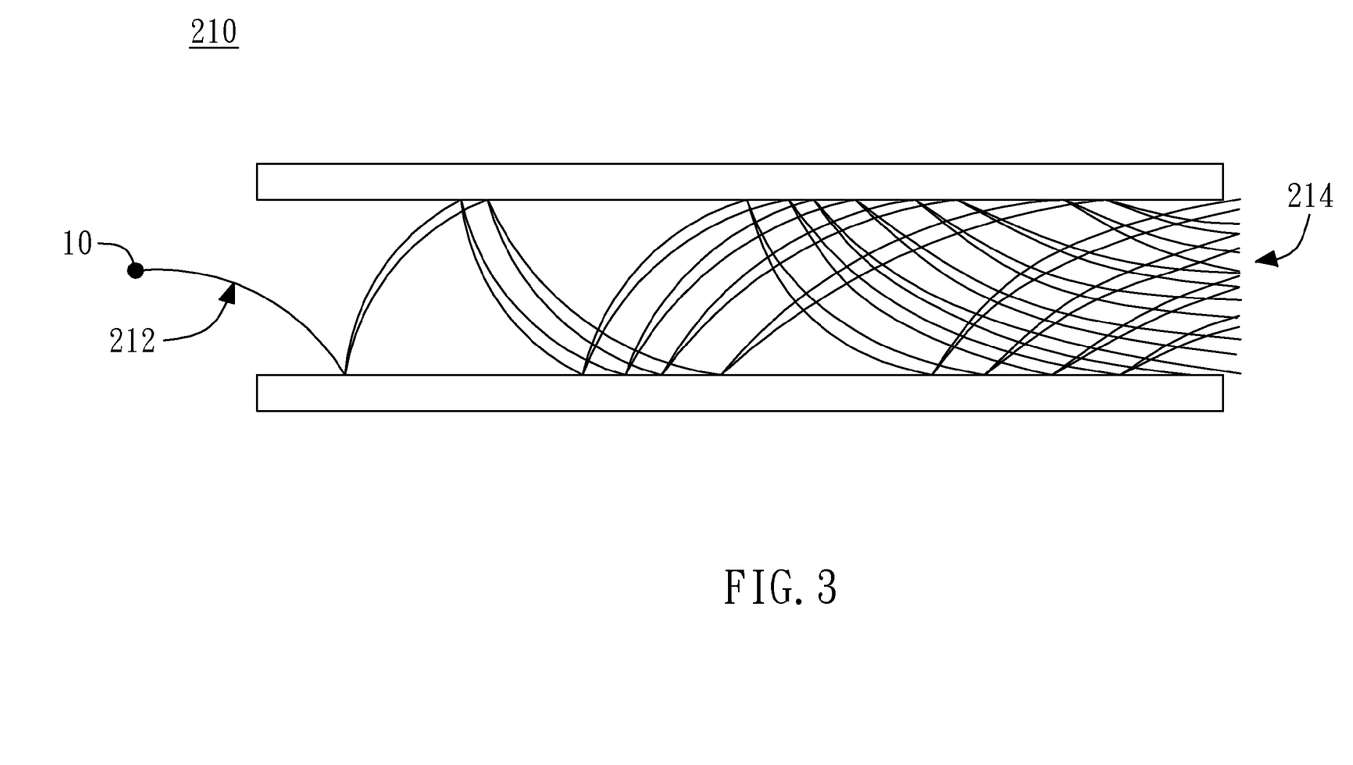
FIG. 3 is a schematic diagram for illustrating how one electron is amplified in one of the MCP.

Original particles to be detected are converted into charged particles, such as electrons, by the charged particle multiplier device 110 if the original particles are not charged. The charged particle multiplier device 110 for detecting the original particles, in one embodiment, can include a microchannel plate (MCP) (per se without anode), wherein the MCP is a two-dimensional sensor that can detect electrons, ions, UV rays, X-rays or gamma rays, and amplifies the detected signal. Details of the MCP can be referred to, for example the publication by Goldstein et al., "Scanning Electron Microscopy and X-Ray Microanalysis," Second Edition, published by Plenum, 1992, Chapter 4, and can be referred to FIG. 2 and FIG. 3, wherein a schematic structure of a microchannel plate 200 is illustrated in FIG. 2 and a schematic structure of how one electron is amplified in one of the a plurality of microchannels is illustrated in FIG. 3. A plurality of microchannels is arrayed within a plate as shown in FIG. 2, wherein each channel 210, for example, will pass through the plate.

In FIG. 3, one electron 10 is injected into one channel 210 as input electrons 212, and then is reflected and amplified through the channel 210. A potential gradient is established along the channel 210 when a voltage is applied between input and output sides of the MCP. Multiple secondary electrons are emitted when one electron 10 enters a channel 210 from the input side and strikes its inner wall. These secondary electrons are accelerated by the potential gradient to draw parabolic trajectories that are determined by their inner velocities. They then strike the opposite wall in the channel 210 causing further secondary electrons to be emitted. The electrons in this way travel towards the output end while striking the inner wall of the channel 210 repeatedly. As a result, a large number of exponentially increased electrons as output electrons 214 are extracted to the charged particle detection device 130 by the electric field or potential between the charged particle multiplier device 110 and the charged particle detection device 130 from the output side.

The charged particle multiplier device 110 for detecting electrons, in one embodiment, can include an electron multiplier (per se or without anode), wherein the electron multiplier uses a vacuum-tube structure that multiplies incident charges. In a process called secondary emission, a single electron can, when bombarded on secondary emissive material, induce emission of roughly 1 to 3 electrons. If an electric potential is applied between this metal plate and another one, the emitted electrons will accelerate to the next metal plate and induce secondary emission of still more electrons. This can be repeated a number of times, resulting in a large shower of electrons all accelerated to the charged particle detection device 130 by the electric field or potential between the charged particle multiplier device 110 and the charged particle detection device 130.

The charged particle multiplier device 110 for detecting photons, in one embodiment, can include phosphor, a photocathode, and a microchannel plate or an electron multiplier, wherein the photocathode is used for transferring photons into charged particles, most electrons. When photons strike onto a surface of the photocathode, a negatively charged electrode in a light detection device, a plurality of electrons are emitted and then accelerated to the charged particle detection device 130 by the electric field or potential between the charged particle multiplier device 110 and the charged particle detection device 130. The electron emission, can be current amplifier, from the photocathode is then forward to the electron multiplier for multiplying incident charges.

One important function of the charged particle multiplier device 110 is to acquire the first level gain, and the charged particle detection device 130 is to acquire a second level gain. Further, the function of the charged particle detection device 130 can generate a large output signal current (more than 0.1 mA) with low noise level. The charged particle detection device 130, in one embodiment, can be semiconductor photodiode detector (SPD), such as PiN photodiodes.

The drift tube type housing 120 between the charged particle multiplier device 110 and the charged particle detection device 130 is used for confining charged particles generated by the charged particle multiplier device 110. The electric field or potential applied between the charged particle multiplier device 110 and the charged particle detection device 130 can be high voltage, such as ±1 KV to ±20 KV or above/below, to accelerate the charged particles. Because gain of the semiconductor photodiode detectors depends on landing energy of the charged particles, adjusting this applied electric field or potential can increase gain of the charged particle detection device 130 significantly, which is impossible in the prior arts. Further, white noise issue in the Phosphor-PMT does not appear in the design.

The output signal in the signal output interface 132, forward to an amplifier in which transferred from current signal to voltage signal. The particle detection system 100 obtains maximum gain up to $10^{10}$ with maximum output signal current more than mA level, in one embodiment with 10 KV applied electric field or potential. This distinct performance would be impossible for any prior particle detection system.

A metal mesh 112, which is an optional part, can be configured within the drift tube housing 120 and in front of an incident surface of the charged particle multiplier device 110 for preventing the leakage of the electric field or potential applied on the charged particles multiplier device 130.

Figure 4:
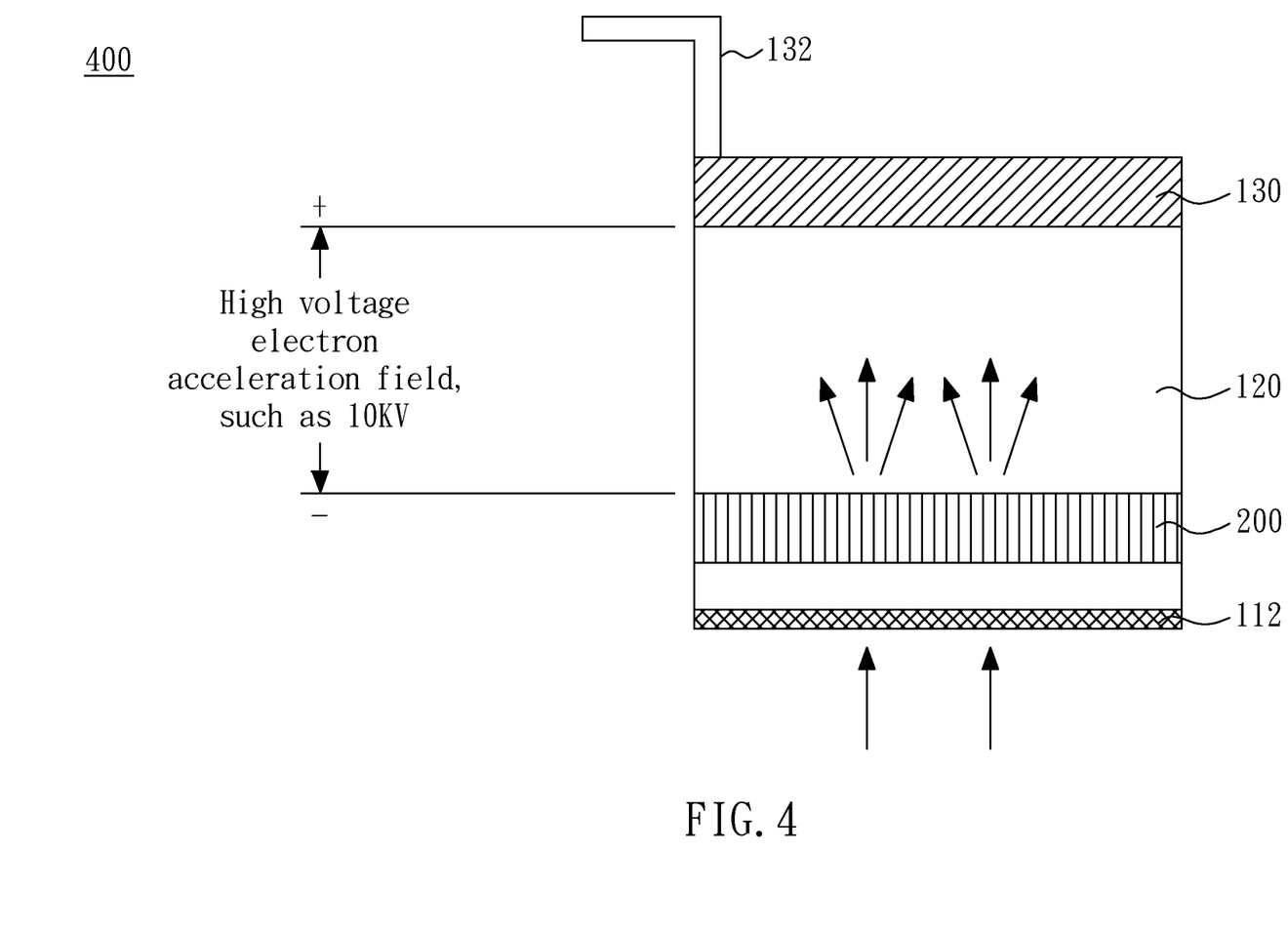
FIG. 4 is a schematic diagram for illustrating electron detection system according to an embodiment of the present invention.

One important application of the particle detection system is to detect electrons. As shown in FIG. 4, an electron detection system 400 includes a metal mesh 112, a MCP 200, a drift tube type housing 120, a charged particle detection device 130, such as PiN photodiode detector, and a signal output interface 132. The MCP 200, in one embodiment, attracts original particle, for example about 10 nA electrons and amplifies these electrons to a first level gain, for example 1000 times gain. And, these amplified electrons will be accelerated by a 10 KV electric field or potential within the drift tube type housing 120. The charged particle detection device 130, which in one embodiment uses SPD or PiN photodiode detector, will obtain about 2000 times gain with about 20 mA output signal. Compared with a multi-stage MCP assembly with maximum 10 to 20 uA output signal current (about 2K gain), this invention can provide maximum 10 to 20 mA output signal current (about 2 million gain). The later which is thousand times larger. In theory MCP has the capability to obtain 2 million gain, but output current of anode is limited to 20 uA. Therefore, real value of multi-stage MCP assembly can only obtain 1K to 2K gain for the 10 nA signal current.

Figure 5:
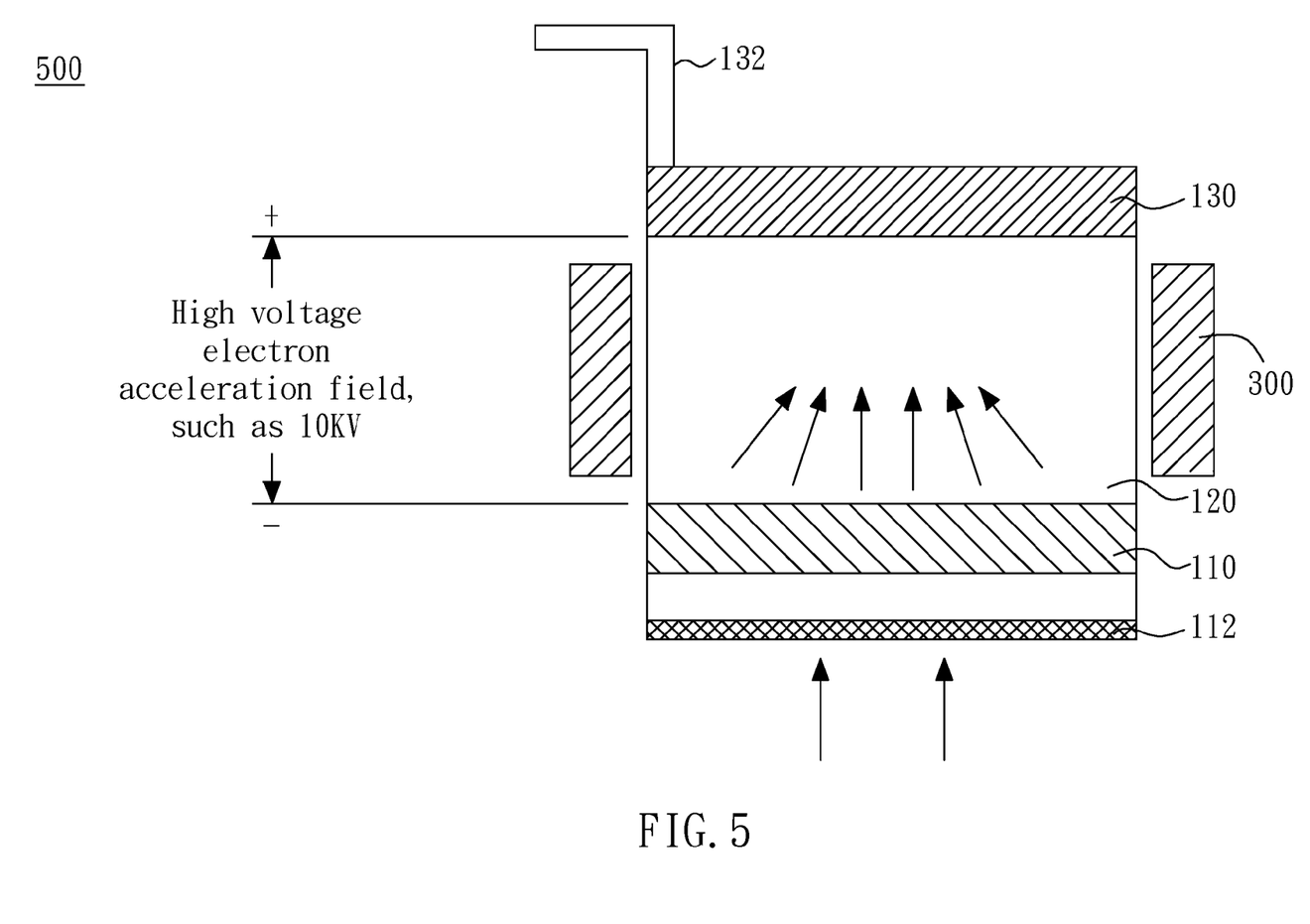
FIG. 5 is a schematic diagram for illustrating particle detection system according to another embodiment of the present invention.

Referring to FIG. 5, a particle detection device 500 is provided, wherein a lens 300 is configured to condense or converge the charged particles from the charged particle multiplier device 110 into the charged particle detection device 130 in a preferred embodiment. The lens 300 can be configured within or outside the housing 120, although in FIG. 5 the lens 300 is outside the housing 120. The metal mesh 112 is configured to receive the original particles, and as an incident surface in front of the charged particle multiplier device 110. The signal output interface 132 contacts to the charged particle detection device 130 and outputs signals to an image processing unit (not shown in FIG. 5).

The original particles to be detected come to the metal mesh 112 and reach the charged particle multiplier device 110. Then, the original particles are converted to charged particles if the original particles are electric neutral, and multiplied by the charged particle detection device 130. The charged particles are next accelerated by an electric field between the charged particle detection device 130 and the charged particle multiplier device 110, and also condensed or converged by the lens 300 to the charged particle multiplier device 110. The charged particles are detected and transferred as signals by the charged particle detection device 130, and the signals are output though the signal output interface 132.

The charged particle multiplier device 110 can be MCP, and the charged particle detection device 130 can be SPD in a preferred embodiment.

Figure 6:
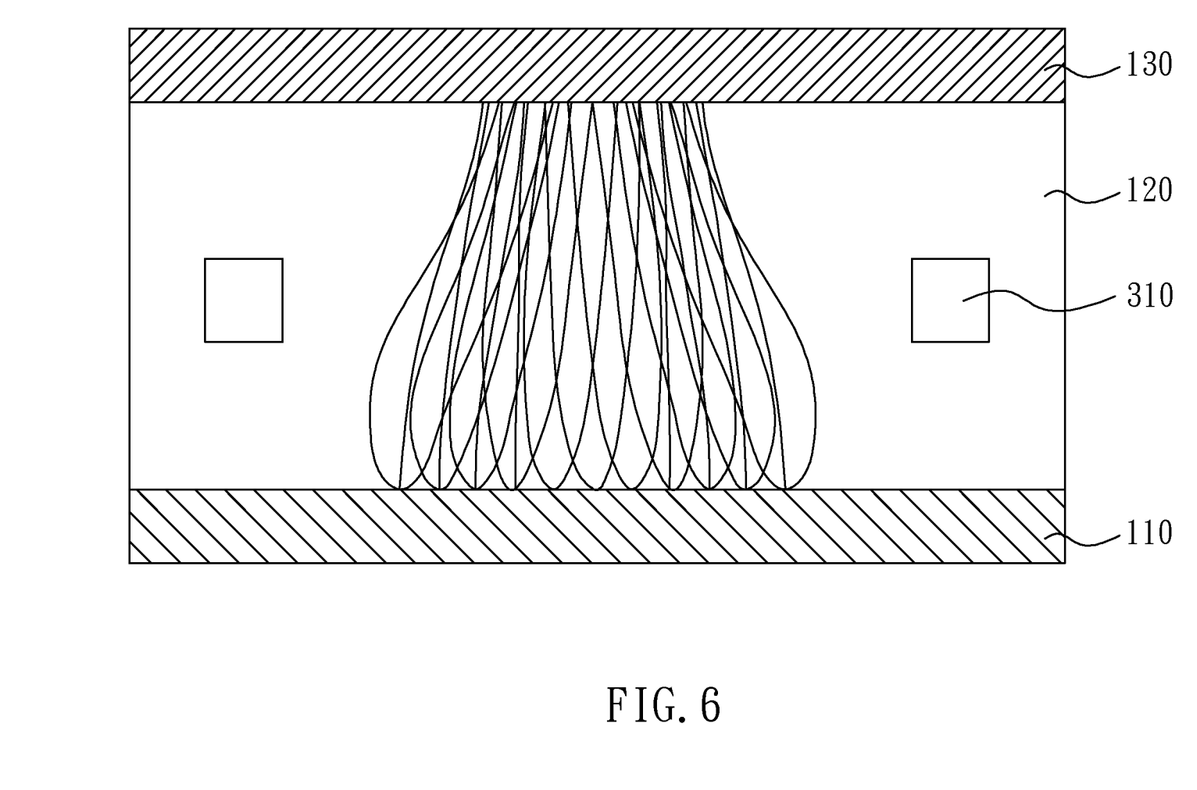
FIG. 6 is a schematic diagram for illustrating an electrostatic lens to condense multiplied charged particles in the particle detection system according to an embodiment of the present invention.

The lens 300 in FIG. 5 can be electrostatic lens or magnetic lens. Please refer to FIG. 6, an electrostatic lens 310 is configured inside the housing 120 to condense or converge the charged particles from the charged particle multiplier device 110 to the charged particle detection device 130. A simulation is shown how the charged particles are condensed or converged by the electrostatic lens 310. Hence, only a portion of the charged particle detection device 130 will receive the charged particles, so the SPD can use smaller area to receive the signal charged particles to enhance bandwidth.

Figure 7:
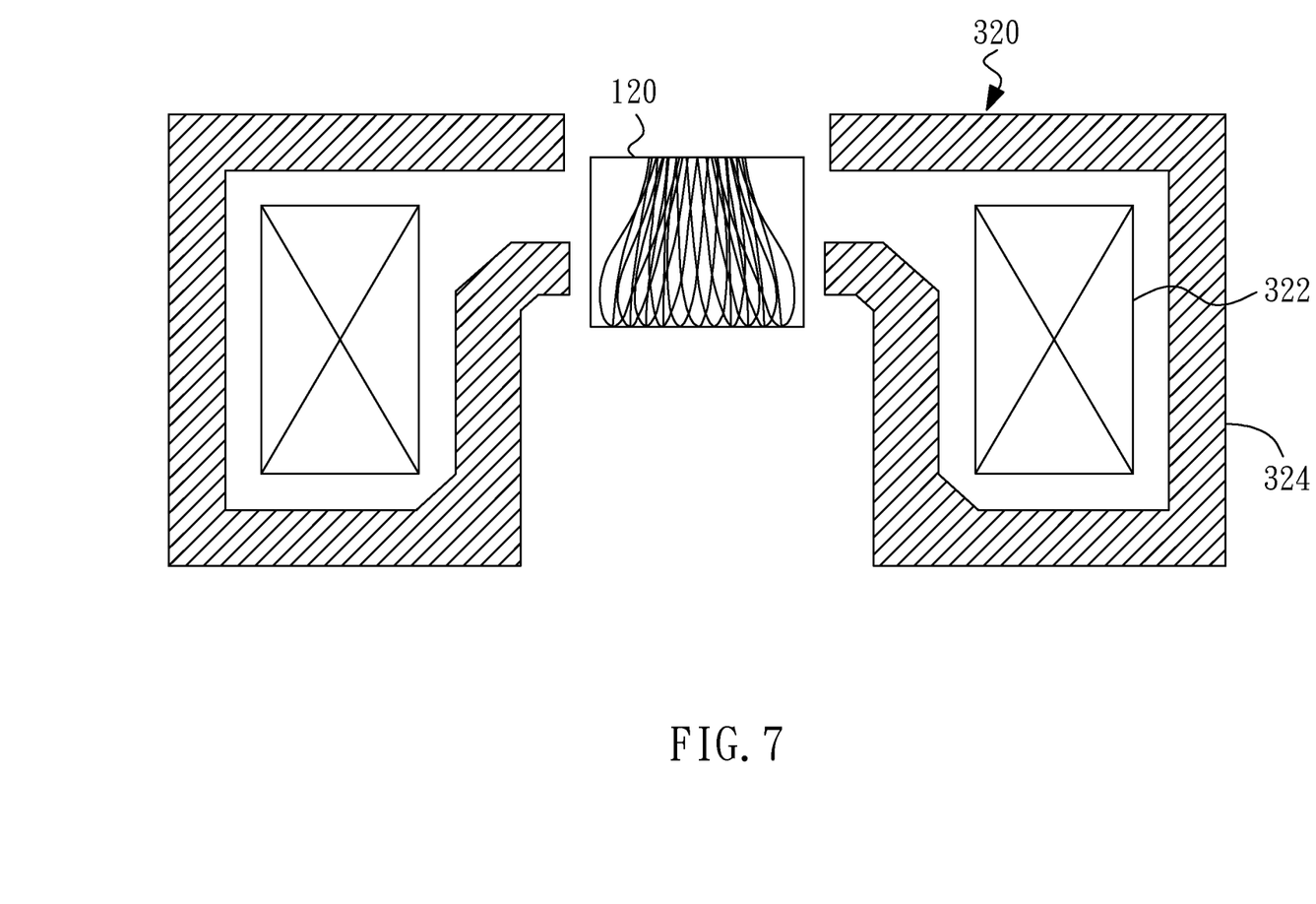
FIG. 7 is a schematic diagram for illustrating a magnetic lens to condense multiplied charged particles in the particle detection system according to an embodiment of the present invention.

A magnetic lens 320 in FIG. 7 is configured outside the housing 120 to condense or converge the charged particles. The magnetic lens 320 includes an excitation coil 322 which provides magnetic field, and a york 324 to guide the generated magnetic field to the opening of the york 324 in FIG. 7. This provides another embodiment to condense or converge the charged particle in the housing 120. The choice of using electrostatic lens or magnetic lens depends on the designer's requirement.

Figure 8A:
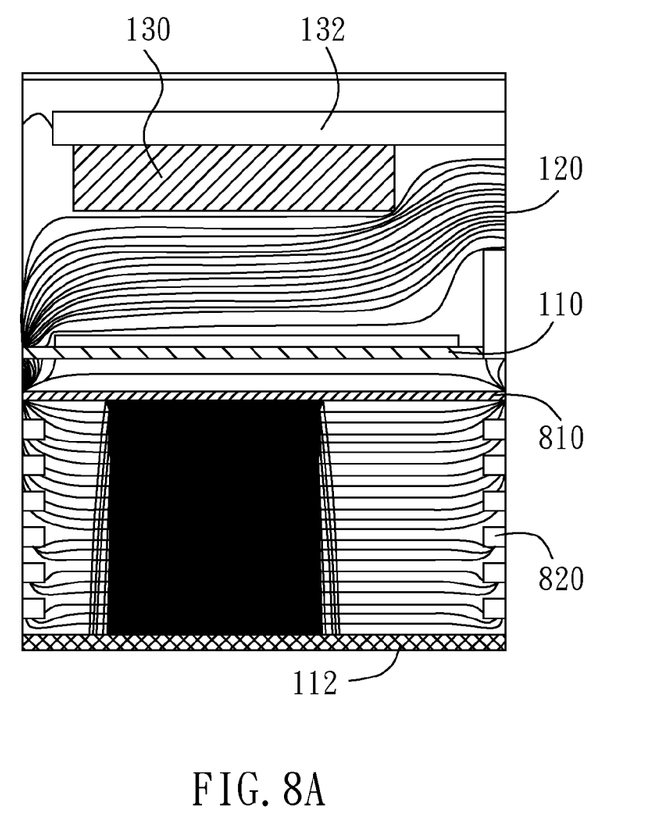
FIGS. 8A and 8B are schematic diagrams for illustrating an energy filter and driving means applied to the particle detection system according to an embodiment of the present invention.
Figure 8B:
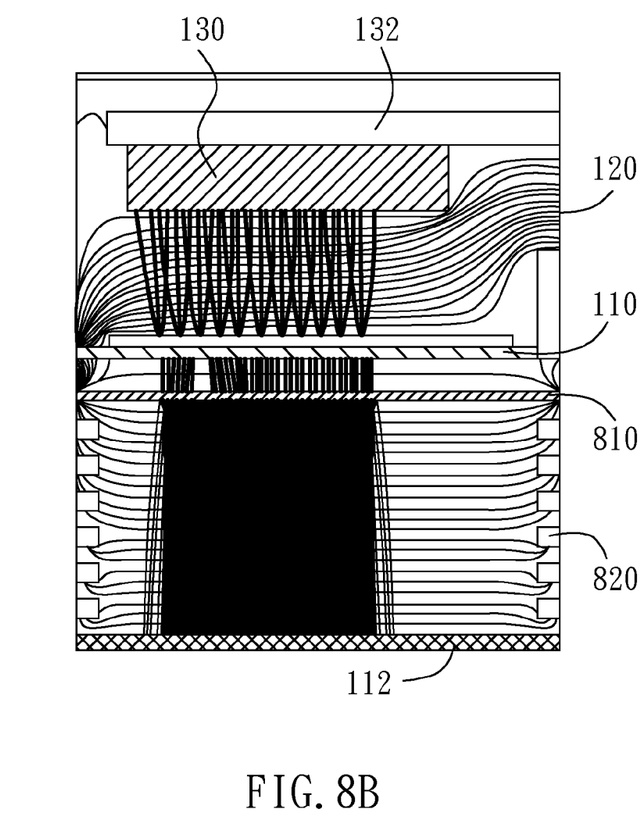

If charged particles, such as electrons, are needed to be detected by the particle detection system 100, an energy filter can be provided to filter out some electrons with certain energy. As shown in FIG. 8A and FIG. 8B, an energy filter 810 is provided between the charged particle multiplier device 110 and the metal mesh 112. In FIG. 8A, if electrons with energy lower than a predetermined value, all electrons are blocked by the energy filter 810. In FIG. 8B, if potential of the energy filter 810 sets a value of −11002V, and the electrons have energy of 11000 eV, some electrons can pass through the energy filter 810 to the charged particle multiplier device 110.

A means 820 for driving charged particles, such as electrons, from the metal mesh 112 to the energy filter 810 is also provided in both FIG. 8A and FIG. 8B. Because in common EBWIT or SEM, the metal mesh 112 and housing 120 are set zero potential, the electrons reach the metal mesh 112 will not to an energy barrier of the energy filter 810 with negative potential. Therefore, the means 820 for driving the electrons is used to force the electrons to the energy filter 810, not the housing 120. If the original charged particles are positive, the driving means 820 is configured between the energy filter 810 and the charged particle multiplier device 110 if the energy filter 810 is negative potential and the charged particle multiplier device 110 is zero potential. The driving means 820, which will provide a little potential barrier to the charged particles to the housing 120, such that the most charged particles will be forced to the energy filter 810. The driving means 820, in one embodiment, can be drift tube structure.

In FIG. 8A and FIG. 8B, two simulations are shown that electrons, as charged particles to be detected, after through the metal mesh 112, are forced by the driving means 820 and filtered out by the energy filter 810 to the charged particle multiplier device 110. It is also noted that there is no lens to condense the electrons multiplied by the charged particle multiplier device 110 in FIG. 8A and FIG. 8B.

Figure 9:
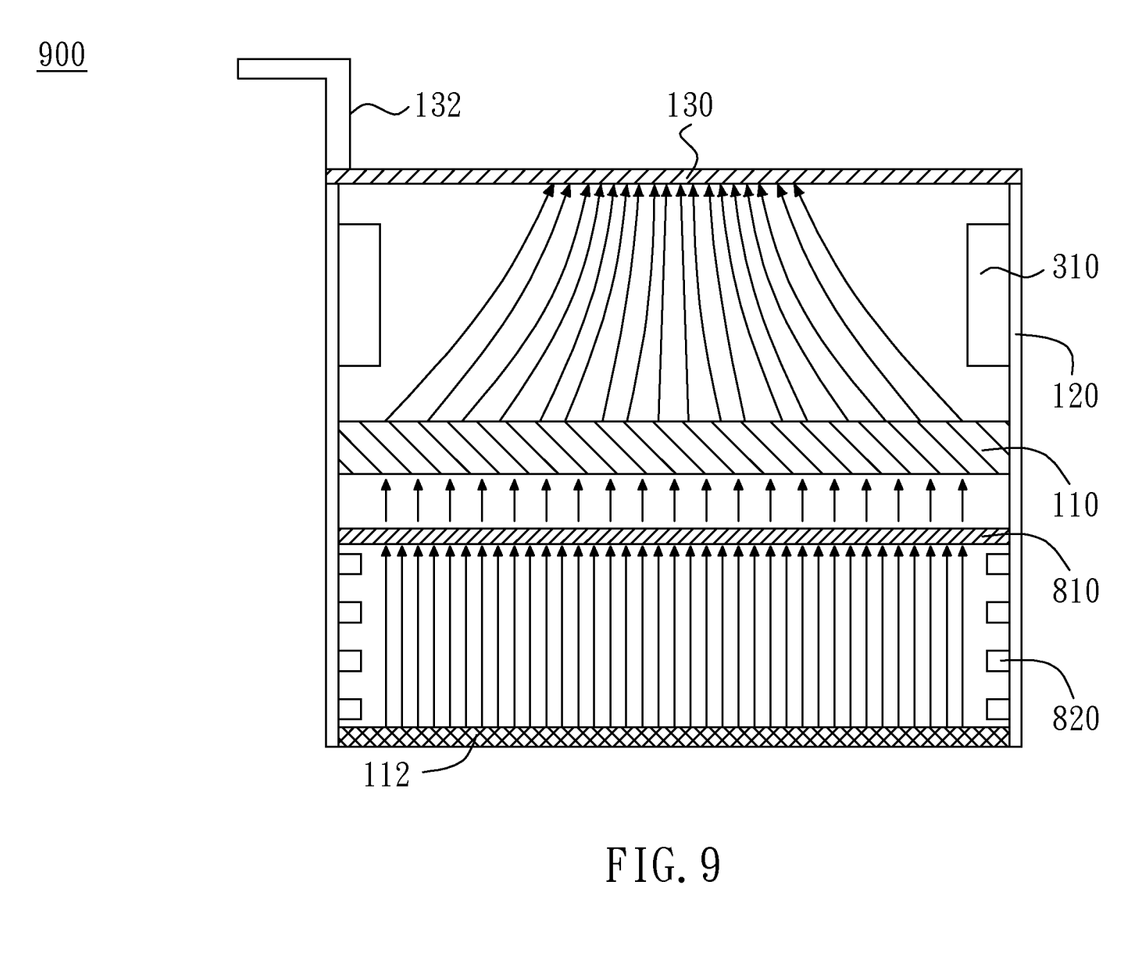
FIG. 9 is a schematic diagram for illustrating an electron detection system according to an embodiment of the present invention.

Referring to FIG. 9, an electron detection system 900 is provided, in which a housing 120 includes a metal mesh 112, an energy filter 810, a charged particle multiplier device 110, a charged particle detection device 130 in sequence. A driving means 820 is configured at sidewall of the housing 120 between the metal mesh 112 and the energy filter 810 to force electrons (as shown in arrow head lines in FIG. 9) from the metal mesh 112 to the energy filter 810. The electrons through the energy filter 810 will reach and multiplied by the charged particle multiplier device 110. And then the multiplied electrons are accelerated by an electric field between the charged particle multiplier device 110 and the charged particle detection device 130, and condensed or converged by the electrostatic lens 310 to the charged particle detection device 130. The charged particle detection device 130 then received the electrons and transfers to signals corresponding to the original electrons before entering the charged particle multiplier device 110. The signals are then outputted through the signal output interface to an image processing unit.

Figure 10:
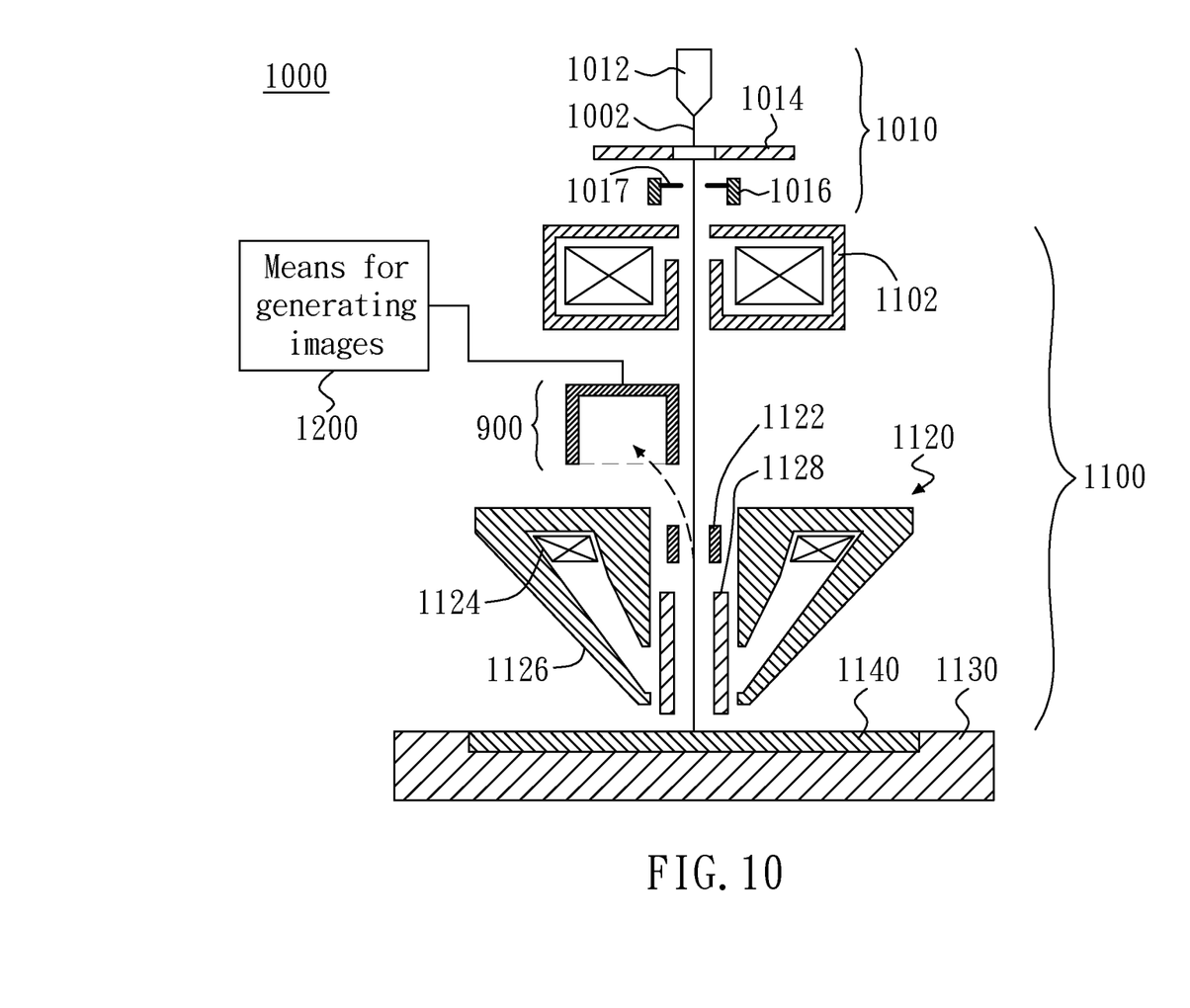
FIG. 10 is a schematic diagram for illustrating an electron detection system applied to an E-beam wafer inspection tool.

In FIG. 10, a EBWIT 1000 is provided, which comprises an E-gun 1010, a column 1100, and a stage 1130. The E-gun 1010 includes a field emission cathode 1012 for providing E-beam 1002, an anode 1014 for applying electric field to the cathode 1012, a terminal electrode 1016 for providing zero potential to the E-beam 1002, and a gun aperture 1017 for cutting off the E-beam 1002 with larger polar angles. The column 1100 includes a condenser 1102 for weakly focusing the E-beam, and an electromagnetic lens 1120 for focusing the E-beam on a specimen 1140. The electromagnetic lens 1120 includes an excitation coil 1124 for providing magnetic field, and a york 1126, covering the excitation coil 1124, will guide the magnetic field out of york 1126, which is also called as pole-piece. At least a pair of electrodes 1128 inside the york 1126 provides electric field to the E-beam as a retarding force. The E-beam 1002 then bombarding the specimen 1140 and a plurality of signal electrons, also known as secondary electrons, is emanated back and deflected by a Wien filter 1122 to the detector 900.

The design of this invention can detect not only electrons or charged particles, but also photons or even other electric neutral particles. The charged particle multiplier device provides a first gain level and a function to convert original particles into charged particles if the original particles are electric neutral. An applied electric field or potential between the charged particle multiplier device and the charged particle detection device can increase gain of the charged particle detection device, and a second gain level is obtained in this design. Further, by using the electric field or potential, the particle detection system can increase gain compared to or larger than the multi-stage MCP assembly, with thousand times larger output signal current than the multi-stage MCP assembly. By using the condense lens in the particle detection system, a smaller area of SPD can be used to receive multiplied charged particles, and bandwidth of the SPD can be further enhanced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the invention as limited only by the appended claims.

What is claimed is:

1. An E-beam wafer inspection tool, comprising:
   an electron gun for emitting a primary beam;
   a primary beam condenser lens for condensing the primary beam;
   an objective lens for receiving the primary beam from said primary beam condenser lens and focusing the primary beam on to a surface of a specimen; and
   a particle detection system, comprising:
   a charged particle multiplier device for receiving original signal particles to be detected and generating a plurality of multiplied charged particles, and the detected signal particles include a secondary charged particles emitted from the surface of the specimen;
   a charged particle detection device for receiving the plurality of multiplied charged particles and generating output signal corresponding to the original signal particles; and
   a condenser lens is configured between said charged particle multiplier device and said charged particle detection device to converge the plurality of multiplied charged particles into said charged particle detection device.

2. The E-beam wafer inspection tool according to claim 1, wherein an electric potential is applied between the charged particle multiplier device and the charged particle detection device to accelerate the plurality of multiplied charged particles to arrive the charged particle detection device to obtain the second level gain.

3. The E-beam wafer inspection tool according to claim 1, wherein said charged particle detection device is a semiconductor photo diode.

4. The E-beam wafer inspection tool according to claim 3, wherein said original signal particles are original charged signal particles.

5. The E-beam wafer inspection tool according to claim 4, wherein said charged particle multiplier device is a microchannel plate.

6. The E-beam wafer inspection tool according to claim 4, wherein said original signal particles are electrons.

7. The E-beam wafer inspection tool according to claim 6, wherein said charged particle multiplier device is an electron multiplier.

8. The E-beam wafer inspection tool according to claim 7, wherein an electric field is applied between the charged particle multiplier device and the charged particle detection device to accelerate the plurality of multiplied charged particles.

9. The E-beam wafer inspection tool according to claim 7, wherein the condenser lens is an electrostatic lens configured between said charged particle multiplier device and said charged particle detection device.

10. The E-beam wafer inspection tool according to claim 9, wherein gain of the particle detection system can be adjusted by an electric field from the electrostatic lens.

11. The E-beam wafer inspection tool according to claim 10, wherein a potential difference of the electric field applied between the charged particle multiplier device and the charged particle detection device can be ranged from 5 KV to 15 KV.

12. The E-beam wafer inspection tool according to claim 11, further comprising a metal mesh configured to said charged particle multiplier device.

13. The E-beam wafer inspection tool according to claim 12, further comprising an energy filter between the charge particle multiplier device and the metal mesh.

14. The E-beam wafer inspection tool according to claim 13, further comprising a means for driving the original particles from the metal mesh to the energy filter.

15. The E-beam wafer inspection tool according to claim 14, wherein the means for driving the original particles is draft tube structure.

* * * * *